United States Patent [19]

Soyuer

[11] Patent Number: 5,422,603
[45] Date of Patent: Jun. 6, 1995

[54] CMOS FREQUENCY SYNTHESIZER

[75] Inventor: Mehmet Soyuer, Yorktown Heights, N.Y.

[73] Assignee: International Business Machines Corporation, Armonk, N.Y.

[21] Appl. No.: 253,005

[22] Filed: Jun. 2, 1994

[51] Int. Cl.⁶ .................. H03L 1/00; H03L 7/089; H03L 7/18
[52] U.S. Cl. .................. 331/1 A; 331/8; 331/17; 331/25; 327/3; 327/40; 327/107
[58] Field of Search .................. 331/1 A, 8, 17, 25, 331/57; 307/494–497, 514–516, 525–528; 328/133, 134, 155; 333/172

[56] References Cited

U.S. PATENT DOCUMENTS

| | | | |
|---|---|---|---|
| 4,636,748 | 1/1987 | Latham, II | 331/17 |
| 4,959,618 | 9/1990 | Shier | 328/155 |
| 5,038,120 | 8/1991 | Wheatley et al. | 332/128 |
| 5,053,649 | 10/1991 | Johnson | 307/514 |
| 5,057,793 | 10/1991 | Cowley et al. | 331/1 |
| 5,157,341 | 10/1992 | Fobbester et al. | 328/133 |
| 5,206,889 | 4/1993 | Unkrich | 331/1 A X |
| 5,233,314 | 8/1993 | McDermott et al. | 331/17 |
| 5,239,455 | 8/1993 | Fobbester et al. | 363/60 |
| 5,276,408 | 1/1994 | Norimatsu | 331/8 |
| 5,311,149 | 5/1994 | Wagner et al. | 331/1 A |

OTHER PUBLICATIONS

Mehmet Souyer, et al "Frequency Limitations of a Conventional Phase-Frequency Detector", *IEEE Journal of Solid-State Circuits*, vol. 25, No. 4, Aug. 1990, pp. 1019–1022.

S. Khursheed Enam, et al "NMOS IC's for Clock and Data Regeneration in Gigabit-per-Second Optical-Fiber Receivers", *IEEE Journal of Solid-State Circuits*, vol. 27, No. 12, Dec. 1992 pp. 1763–1774.

*Primary Examiner*—David Mis
*Attorney, Agent, or Firm*—Robert P. Tassinari, Jr.

[57] ABSTRACT

A fully-symmetric high-speed CMOS frequency synthesizer which exhibits minimum dead-zone effects is disclosed. A fully-symmetric phase-frequency detector and a fully differential charge-pump filter combined with a voltage-controlled oscillator are key elements of the invention described.

12 Claims, 5 Drawing Sheets

CMOS FREQUENCY SYNTHESIZER

FIELD OF THE INVENTION

The invention relates to synthesizers, particularly to synthesizers constructed with CMOS devices.

BACKGROUND OF THE INVENTION

Conventional CMOS phase-frequency detector and charge-pump filter combinations used in synthesizers suffer from cross-over distortion in the region of zero phase difference between the input signals. This is primarily due to the asymmetrical configuration at the device level and the low speed of conventional CMOS gates 10 and switches, and it is commonly referred to as the dead-zone problem. High-speed synthesizers are much more susceptible to dead-zone distortion, because such distortion occurs for a larger portion of the cycle time.

In an attempt to overcome this problem, low-jitter synthesizer applications in the prior art employ fast devices such as bipolar NPNs, and utilize symmetric implementation of gates in fast logic families such as ECL (emitter coupled logic). All-NPN phase-frequency detectors and charge pumps, therefore, have been the preferred means for improving speed and reducing dead-zone-induced phase jitter.

If a state-of-the-art BiCMOS technology is not available, however, dead-zone effects and jitter become major concerns in CMOS-only synthesizer designs. It is the purpose of this invention to reduce jitter and improve synthesizer speed without the need for any technology other than CMOS.

SUMMARY OF THE INVENTION

The present invention overcomes the deficiencies in the prior art by providing a fast, CMOS only synthesizer which minimizes jitter. The synthesizer comprises a high-speed fully-symmetric CMOS digital phase-frequency detector coupled to receive input signals to be synthesized, the detector producing an output signal indicative of phase and frequency differences between the input signal and a divided synthesizer output signal. A high-speed fully-differential CMOS charge-pump filter circuit is coupled to receive the output of the detector, the charge pump filter providing a low frequency output signal proportional to the phase and frequency differences between the input and divided synthesizer output signals. A CMOS voltage-controlled oscillator with a differential control input is coupled to receive the output of the charge pump filter, the oscillator providing an output signal of a frequency controllable by the magnitude of the charge pump filter output, the output signal constituting the synthesizer output signal. Finally, a frequency divider is coupled to the output of the voltage-controlled oscillator for producing the divided synthesizer output signal.

FIGURES

DETAILED DESCRIPTION

The invention uses a fully symmetric and fully differential architecture and high speed implementation of CMOS gates to obtain a synthesizer with a phase frequency detector and fully symmetric charge pump filter to overcome the deficiencies of the prior art.

Figure 1:
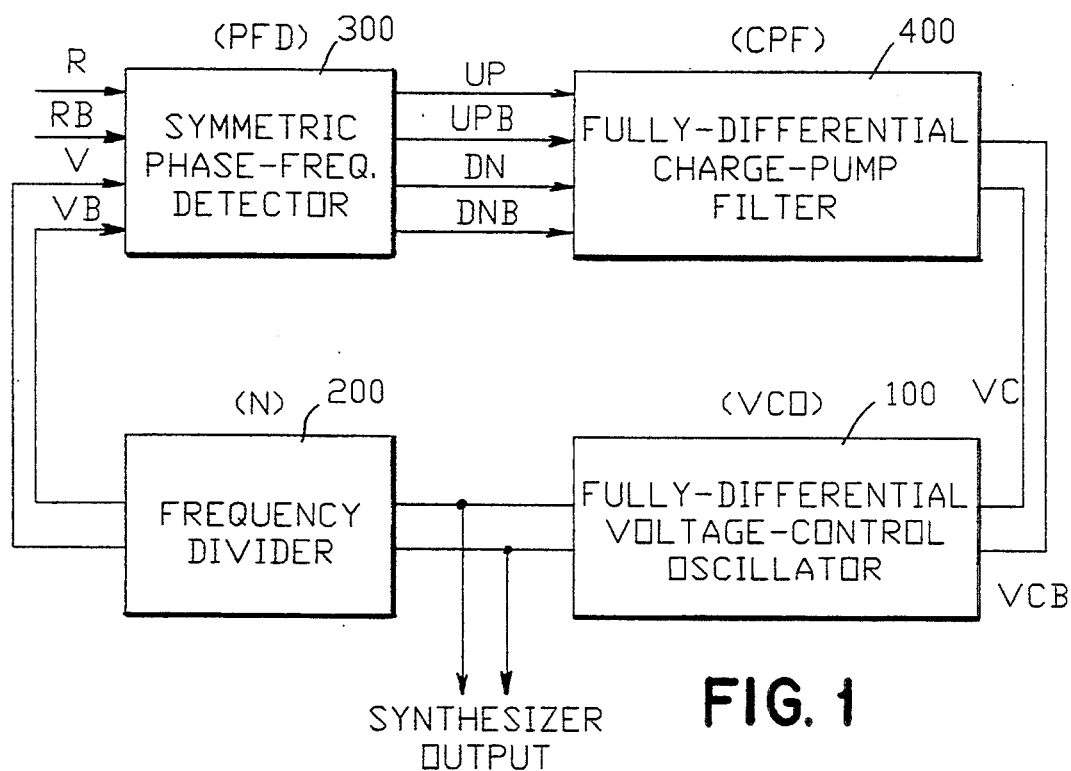
FIG. 1 is a block diagram of a synthesizer in accordance with the present invention.

FIG. 1 is a block diagram of the synthesizer of the present invention. The synthesizer includes a symmetric phase frequency detector 300, a fully-differential charge pump filter 400, a fully differential voltage-controlled oscillator (VCO) 100, the output of which provides a high-speed signal output of the frequency synthesizer phase-locked loop, and a frequency divider 200. These components are discussed in detail below.

Figure 8B:
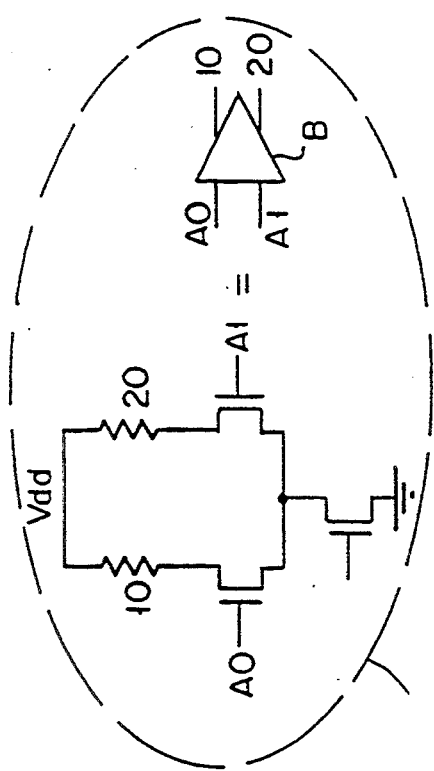
FIGS. 8A and 8B are a voltage controlled oscillator for use in the synthesizer of the present invention.
Figure 8A:
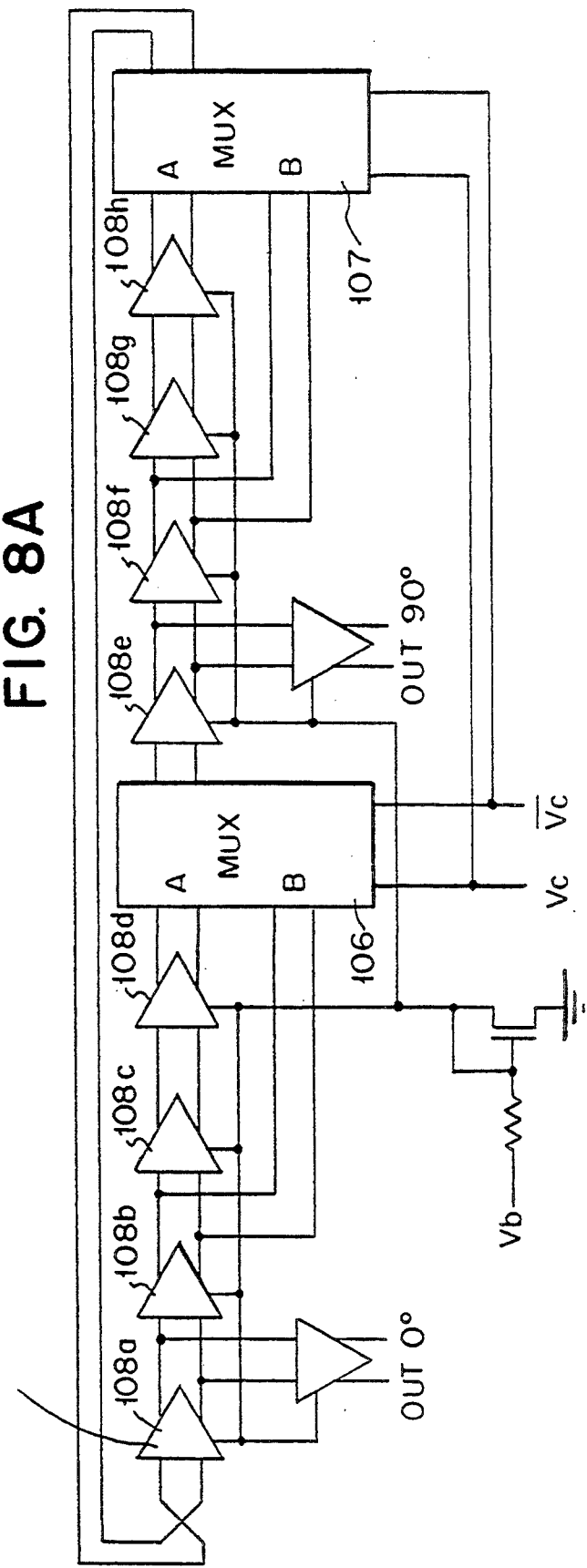

FIGS. 8A and 8B shows the preferred embodiment of the fully-differential VCO 100 with differential control inputs. This VCO consists of two delay lines of different lengths and known as a delay-interpolating VCO. The long delay line is through buffers 108a–d, multiplexer 106, buffers 108e–h, and multiplexer 107. The short delay line is through buffers 108a–b, multiplexer 106, buffers 108e–f, and multiplexer 107. The outputs of the delay lines are combined in a multiplexers 106 and 107. With the multiplexer control at one extreme, the frequency is set by the delay through the first delay line. At the other extreme, the frequency is set by the delay through the second line. When multiplexer control is between its logical low and high states, the multiplexers act as analog mixers, and it is possible to continuously tune the effective delay between these two extremes. The specific design shown in FIG. 8 is slightly more complicated in order to provide both 0 and 90 degrees output phases. The delay elements are source-coupled buffers 108a–h as shown in the inset of FIG. 8. The multiplexers 106 and 107 are conventional two-level Gilbert-cell designs, which are well known in the art. Fully differential circuits are used to reject power supply noise. Because of the differential multiplexer, the VCO control voltage is also differential, which provides better power supply rejection. The maximum tuning range is limited to a 2:1 range to avoid the possibility of harmonic oscillation.

Frequency divider 200 is employed to determine the factor, N, by which the incoming frequency to the synthesizer will be multiplied. That is, $$F_{REF} * N = F_{OUT}.$$

The frequency divider can be any suitable fixed or programmable divider now known or to be developed in the future. Frequency dividers are well known in the art.

The synthesizer also includes symmetric phase-frequency detector (PFD) 200, which receives input signals to be synthesized at its input terminals R and RB, and also feedback signals V and VB from frequency divider 200. The PFD 200 produces digital output signals indicative of the phase and frequency difference between the incoming signal R and the output of frequency divider 200 (which, as discussed above, is equal to the synthesizer output frequency divided by the factor N).

Figure 2:
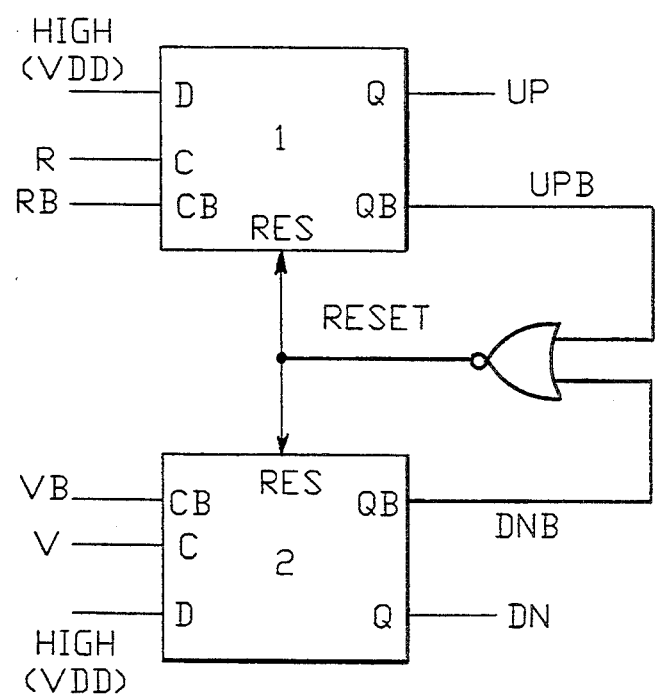
FIG. 2 is a block diagram of a phase frequency detector for use in the synthesizer of FIG. 1.

FIG. 2 shows a preferred embodiment of the fully symmetric PFD 200. It employs two D-type flip-flops 1 and 2, and a two-input NOR gate 3. Flip flop 1 has inputs R and RB, along with a voltage supply input $V_{DD}$ tied to the D input of the flip flop. Flip flop 2 has inputs V and VB received from frequency divider 200, along with voltage supply input $V_{DD}$ tied to the D input of the flip flop. Flip flop 1 has output UP, and its complement UPB (at the Q and QB outputs, respectively, of the flip flop). Similarly, flip flop 2 has output DN, and its complement DNB (at the Q and QB outputs, respectively). Each flip flop also has a reset input RES for receiving a reset signal. A common reset signal is provided by the output of a two-input NOR gate 3, the NOR gate having as input the outputs QB of each flip flop.

Figure 3:
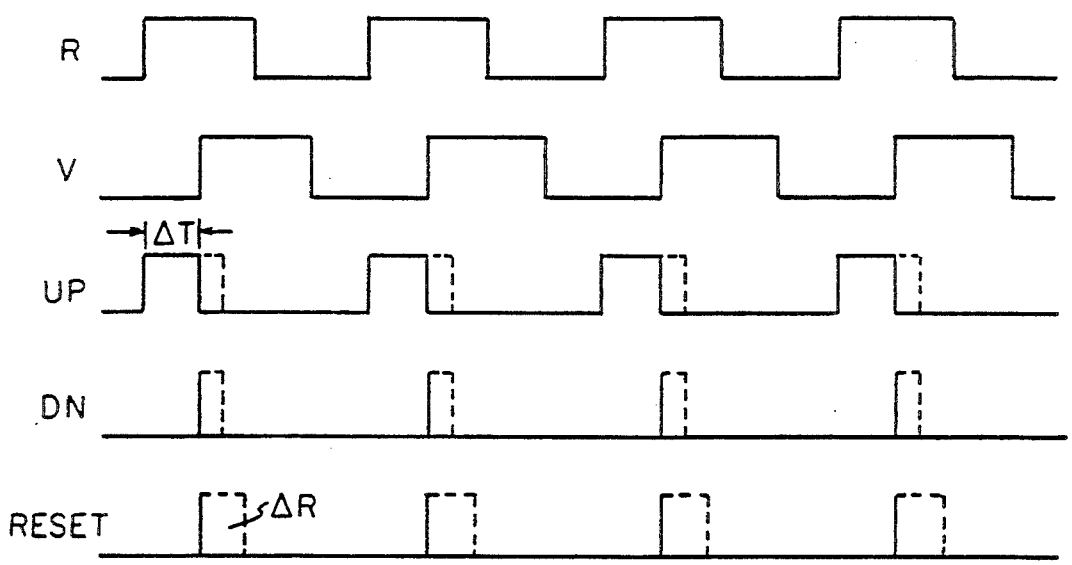
FIG. 3 shows input and output waveforms of the phase frequency detector of FIG. 2 when the input frequencies are equal.
Figure 4:
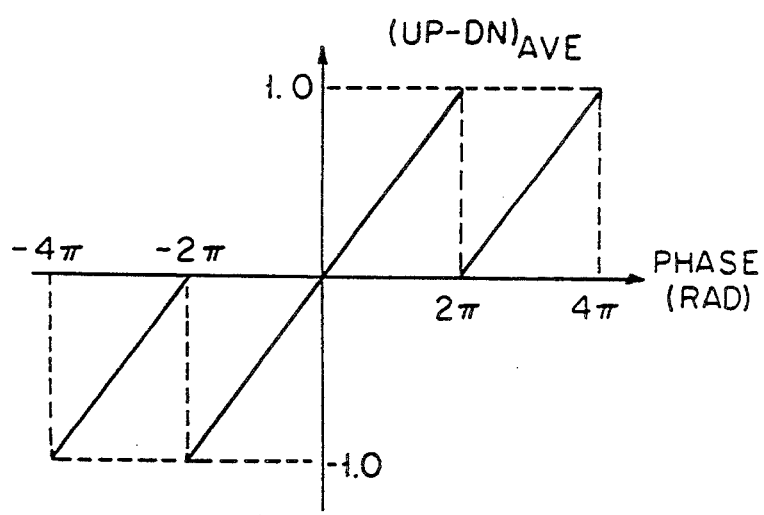
FIG. 4 shows the phase detector characteristics for low frequencies.

The outputs UP and DN respond only to the positive-going inputs of the R and V inputs. Thus, the input duty cycles do not have any effect on the outputs. When the frequencies of the incoming signals are equal, one of the outputs has a duty cycle that is a function of the difference between the input transition times, while the other output remains inactivated, or low. Hence, the time average of the differential output $(UP-DN)_{AVE}$ is a function of the input phase difference. FIG. 3 shows the input and output wave forms for equal input frequencies, and FIG. 4 shows the phase detector characteristics for low frequencies at which the gate delays are neglected.

Figure 5:
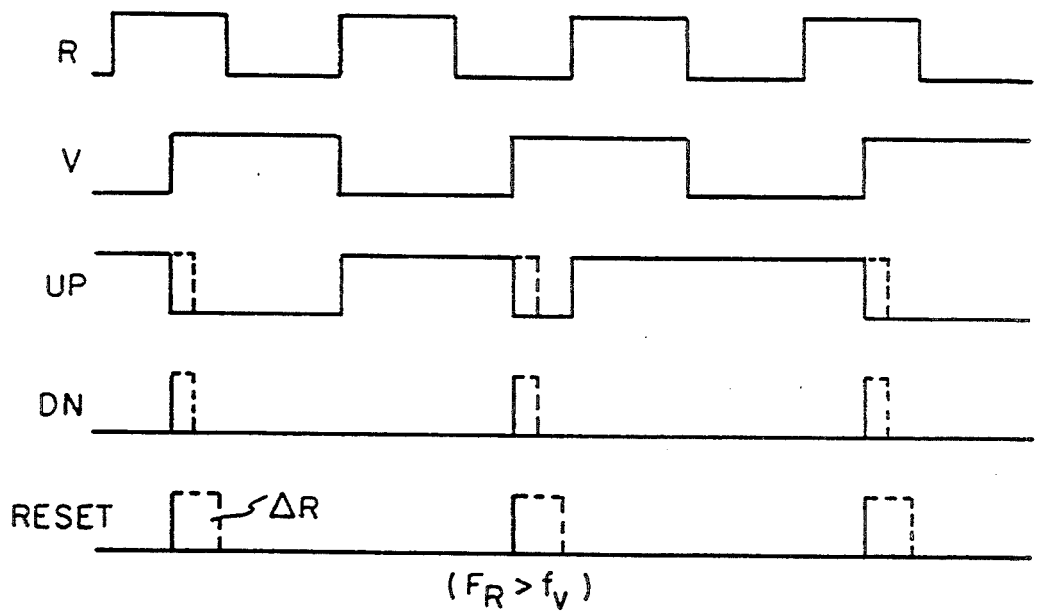
FIG. 5 shows input and output waveforms of the phase frequency detector of FIG. 2 when the input frequencies are unequal.

If the two input frequencies are different (e.g., $f_R > f_V$), the output is set high by R and low by V. The output DN ideally stays low. Furthermore, there is either a single or no V transition between the two successive transitions of R. FIG. 5 shows the input and output waveforms for this case.

Referring back to FIG. 2, assume that both outputs are initially low. A transition at the R input sets the output UP high. A following transition at the V input will set the output DN high, thus creating a reset pulse at the output of the NOR gate. This pulse will reset both of the outputs. When both outputs are returned low, the reset pulse will be terminated by the NOR gate so that the circuit is ready for the next input transition. The reset pulse has a finite width delta-R (shown by the dashed lines in FIGS. 3 and 5) as a result of the gate delays in the circuit. Therefore, a time interval delta-R is required for the circuit to return to its initial conditions before the next set of input transitions appears at R or V. A discussion of the frequency limitations of the circuit of FIG. 2 can be found in Soyuer, et al., which is incorporated herein by reference.

A reset pulse at the output of the two-input NOR gate 3 ends the phase comparison cycle by terminating the pulses at the UP or DN outputs and their complements, UPB or DNB. Duty cycles of these outputs are proportional to the phase and frequency difference between the inputs R/RB and V/VB.

If this circuit were implemented with conventional CMOS gates, at least two problems would arise. First, the feedback path from outputs QB of flip-flops 1 and 2 pass through the NOR gate 3. This path, however, includes several gate delays, which has a major influence on the high-speed operation of the circuit, by limiting the maximum frequency of operation of the synthesizer. Second, conventional CMOS gates are not symmetric with respect to their inputs, and create additional delay mismatches with respect to the R and V inputs of the phase-frequency detector. As discussed above, all of these factors contribute to the so-called "dead-zone" problem. The fully symmetric architecture of the present invention, which uses high-speed CMOS gates in the critical paths, minimizes the effect of the dead-zone on PFD performance.

Figure 6A:
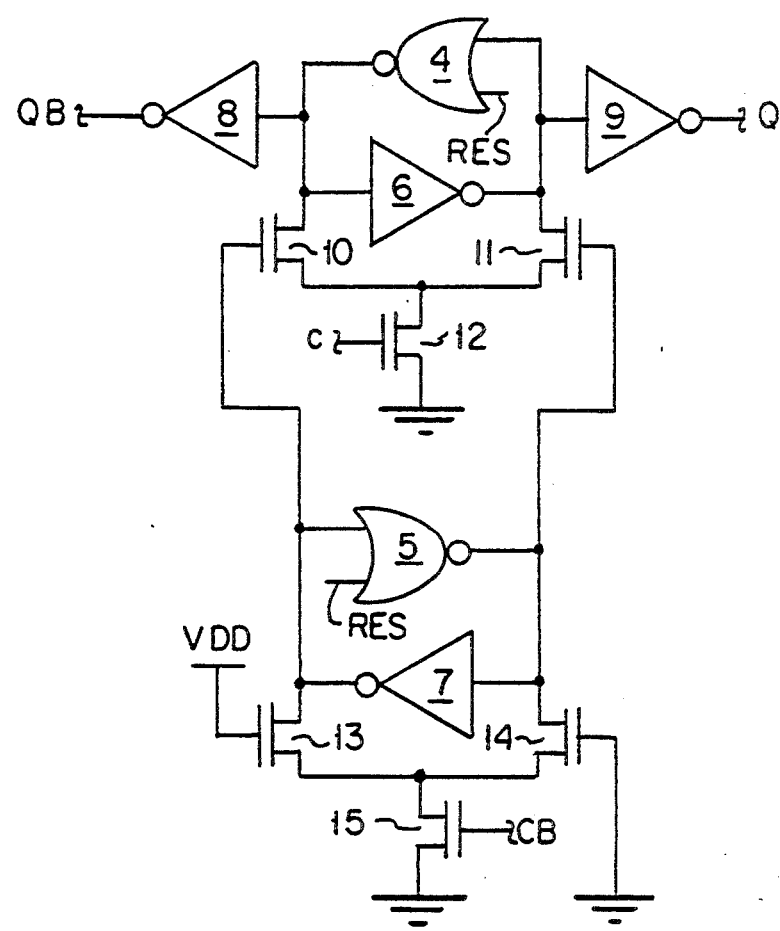
FIGS. 6A, 6B and 6C are preferred implementations of components of the phase frequency detector of FIG. 2.

FIG. 6a shows a preferred embodiment of a D-type flip-flop circuit which can be used to implement PFD 300. It uses symmetrically configured and fast NOR gates 4 and 5, fast inverters 6, 7, 8 and 9 and NMOS transistor devices 10–15. NMOS devices 10–11 and 13–14 form two source-coupled differential pairs. Devices 12 and 15 function as switches with input C and its complement CB.

The circuit operates as follows. When the R input to flip flop 1 is low, RB is high. This causes transistor 15 to conduct, causing transistor 13 to go to a low logic level. When the RB input goes low, transistor 15 opens, storing the low logic level in transistor 13. At the same time, because the input R of transistor 12 went high, transistor 12 conducts, causing the transistor 10 to charge to a level of $V_{DD}$, which in turn causes the input to inverter 6 to go high, the input to inverter 9 to go low, and hence the output UP to go high. Also, the input to inverter 8 is taken high, and hence the complementary output UPB goes low. When a reset signal is received at NOR gates 4 and 5, the output UP is forced low, and the output UPB goes high. Transistors 11 and 14 provide symmetry in the circuit operation, and inverters 6 and 7 are provided to force the deferential pair outputs of the flip-flop to either a low-high condition or a high-low condition (never high-high or low-low).

Figure 6B:
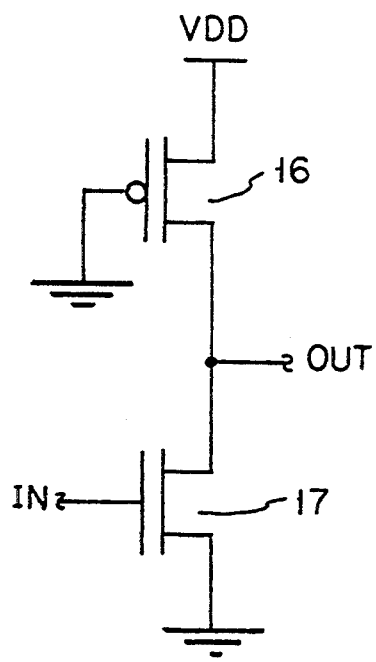
Figure 6C:
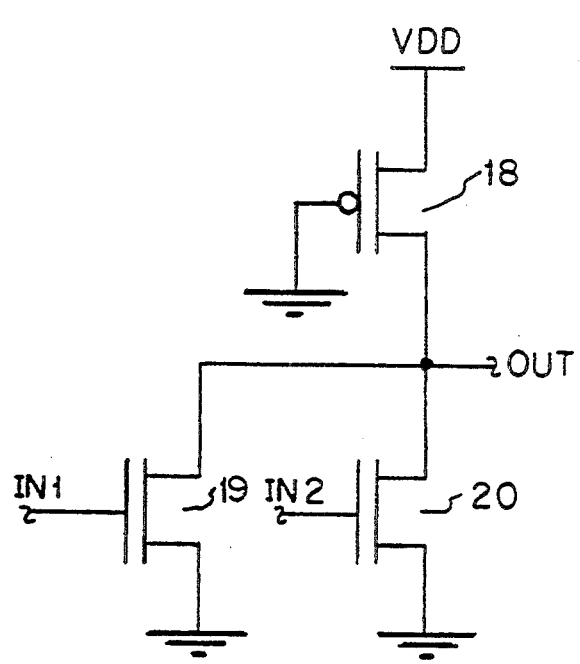

Detailed depictions of the inverters 6-9 and the NOR gates 4 and 5 are shown in FIGS. 6b and 6c, respectively. The inverter circuit of FIG. 3b operates as follows. When the input at transistor 17 is low, transistor 17 will be open, and the output OUT will be at the level $V_{DD}$. When the input IN goes high, transistor 17 will conduct, pulling the output OUT to ground potential. The NOR gates 4 and 5 and inverters 6–9 use linear PFET loads 16 and 18 for high speed, as shown in FIGS. 6b and 6c.

The NOR gate operates as follows. When both inputs IN1 and IN2 are off, transistors 19 and 20 are open, and the output is pulled to a level $V_{DD}$ through transistor 18, which is always on. When either input goes high, its respective transistor is caused to turn on, pulling the output to ground potential. As can be seen, transistors 19 and 20 of the NOR gate are symmetrically configured to reduce the effect of gate delays in the switching speed of the device. The NOR gates are also symmetric with respect to their inputs IN1 and IN2. This NOR gate configuration can be used as the reset NOR gate 3 of FIG. 2.

Conventional CMOS charge-pump filters also contribute to distortion in the region of zero phase difference between the PFD input signals. This is primarily due to the asymmetry between the NMOS and PMOS switches in such circuits. In accordance with the present invention, dead-zone contribution of the charge-pump filter is substantially reduced by using a fully-symmetric charge pump architecture, and by fully differential implementation of the loop filter.

Charge-pump filter (CPF) 400, which receives the outputs UP, UPB, DN and DNB from the PFD 300, eliminates the high frequency components of these signals and produces output signals VC and VCB, to be applied to VCO 100. Signals VC and VCB are low frequency differential error signals indicative of the frequency and phase difference between synthesizer input (R, RB) and output signals.

Figure 7:
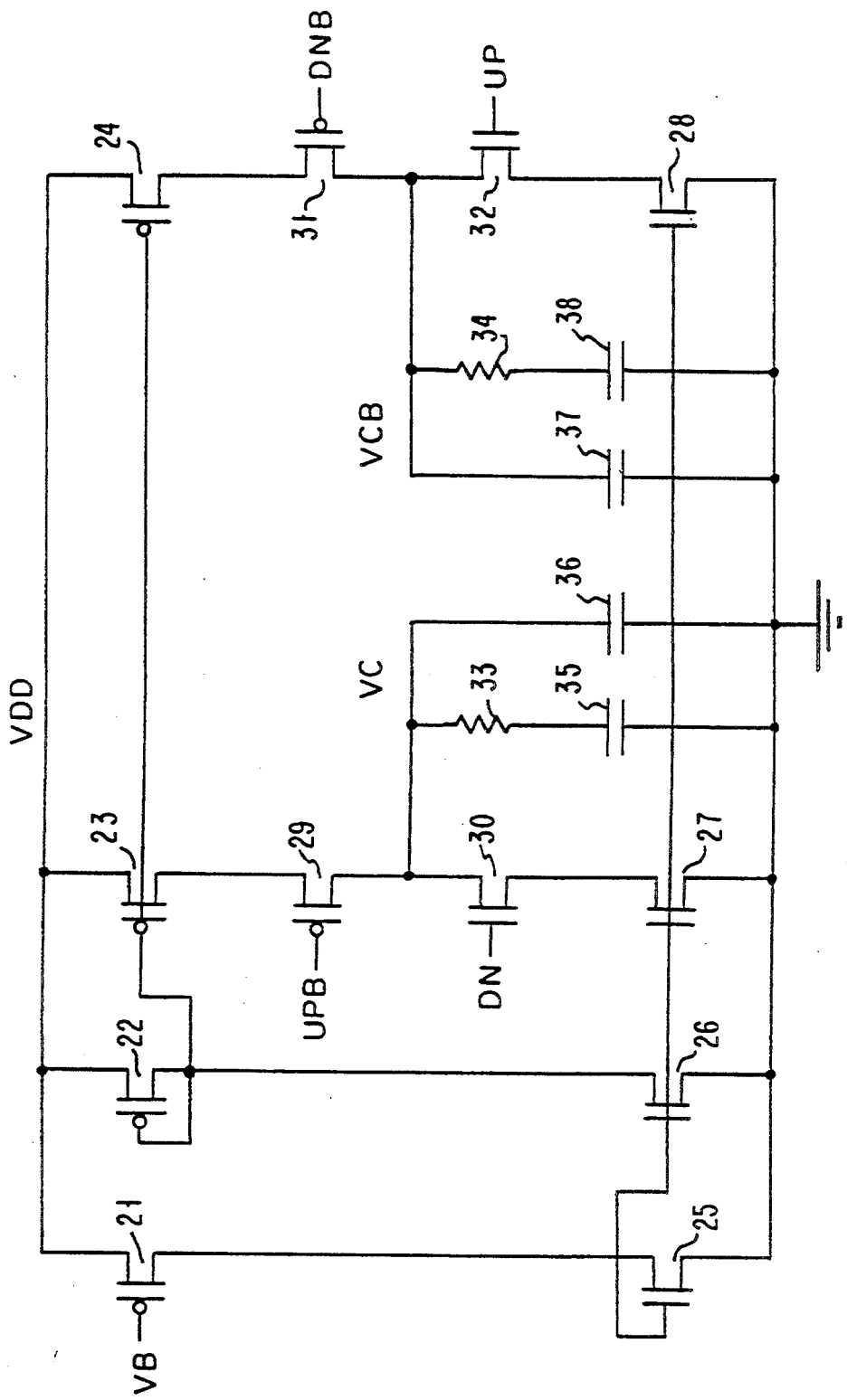
FIG. 7 is a charge pump and filter for use in the synthesizer of FIG. 1.

FIG. 7 shows the preferred embodiment of the charge-pump filter in accordance with the invention. VB is an on-chip generated bias voltage and provides a supply-insensitive current to the charge pump via current mirror devices 21 through 28. The charge pump takes the four outputs (UP, UPB, DN, DNB) of the PFD as inputs and its outputs drive a fully differential low pass filter consisting of resistors 33 and 34 and capacitors 35–38. The filter outputs VC and VCB are connected to the voltage-controlled oscillator 100 (FIG. 1) which preferably is controlled differentially. Differential control is obtained by means of providing both the VC and VCB outputs to the VCO. Because the VCO 100 examines the difference between the VC and VCB signals, any common-mode noise or other error signals appearing in VC and VCB will cancel.

Two NMOS devices 30 and 32 and two PMOS devices 29 and 31 are used for current switching in the charge-pump circuit. Whenever an UP pulse is activated (i.e., high logic level), PMOS device 29 charges the VC node, and NMOS device 32 discharges the VCB node. Similarly, whenever a DN pulse is activated, PMOS device 31 charges the VCB node, and NMOS device 30 discharges the VC node. Therefore, when the output control voltage is taken differentially from the filter, the high-speed mismatch effects from the switching speeds and bias currents of NMOS and PMOS devices are minimized. This is exactly what is required to reduce the susceptibility of the charge pump to crossover distortion for small phase differences between the PFD input signals R/RB and V/VB.

Other symmetric PFD and CPF implementations based on this approach are also possible without departing from the spirit of the invention.

I claim:

1. A CMOS frequency synthesizer, comprising:
   a high-speed fully-symmetric CMOS digital phase-frequency detector coupled to receive input signals to be synthesized, the detector producing an output signal indicative of phase and frequency differences between the input signal and a divided synthesizer output signal;
   a high-speed fully-differential CMOS charge-pump filter circuit coupled to receive the output of the detector, the charge pump filter providing a low frequency output signal proportional to the phase and frequency differences between the input and divided synthesizer output signals;
   a CMOS voltage-controlled oscillator with a differential control input coupled to receive the output of the charge pump filter, the oscillator providing an output signal of a frequency controllable by the magnitude of the charge pump filter output, the output signal constituting the synthesizer output signal;
   a frequency divider coupled to the output of the voltage-controlled oscillator for producing the divided synthesizer output signal.

2. The synthesizer of claim 1, wherein the phase frequency detector comprises:
   two high-speed fully symmetric latches, each having an input, a complementary input, a reset input, an output and a complementary output;
   a high-speed fully symmetric NOR gate coupled to receive an input from the complementary outputs of each of the latches and providing a NOR output to the reset inputs of the latches;
   the outputs of the latches representing differences between the phase of the frequency of signals applied to the inputs of the latches.

3. The synthesizer of claim 2, wherein each of the latches comprises:
   a first source-coupled pair of NMOS devices;
   a second pair of source coupled NMOS devices, the drains of each being connected to the gate of a different one of the first pair of NMOS devices;
   a pair of inverters, the input to each being connected to the drain of a different one of the first pair of NMOS devices, the output of each constituting the output and output-complement of the latch;
   a first inverter connected between the drains of the first pair of NMOS devices, and a second inverter connected between the drains of the second pair of NMOS devices;
   a first NOR gate, one input of which is supplied by the drain of one of the first pair of NMOS devices, the other input of which is supplied by an external reset source, and the output of which is connected to the drain of the other of the first pair of NMOS devices;
   a second NOR gate, one input of which is supplied by the drain of one of the second pair of NMOS devices, the other input of which is supplied by an external reset source, and the output of which is connected to the drain of the other of the second pair of NMOS devices;
   a pair of input switches, each connected to the source coupling of one of the NMOS device pairs, the input switches acting as the input and input-complement to the latch.

4. The synthesizer of claim 3, wherein the inverters each comprise:
   a PMOS device, the gate of which is coupled to ground, and the drain of which is coupled to a voltage source;
   an NMOS device, the drain of which is coupled to the source of the PMOS device to form an output node, and the source of which is coupled to ground;
   the inverter input being provided to the gate of the NMOS device and the output being taken from the output node.

5. The synthesizer of claim 3, wherein each of the NOR gates comprises:
   first and second NMOS devices, the sources of which are coupled to ground, the drains of which are coupled to each other to form an output node, and the gates of each of which are coupled to receive first and second inputs, respectively;
   a PMOS device, the drain of which is coupled to a supply voltage, the source of which is coupled to the output node, and the gate of which is coupled to ground.

6. The synthesizer of claim 1, wherein the fully symmetric CMOS charge-pump filter comprises:
   a voltage supply input;

current mirror means for providing a supply insensitive supply of current;

a fully differential loop filter coupled to receive inputs from the charge pump, the filter including means for converting charge pump input signals into a low frequency control voltage proportional to the magnitude and duty cycle length of the charge pump input signal.

7. A CMOS digital phase-frequency detector, comprising:

two high-speed fully symmetric latches, each having an input, a complementary input, a reset input, an output and a complementary output;

a high-speed fully symmetric NOR gate coupled to receive an input from the complementary outputs of each of said latches and providing a NOR output to the reset inputs of the latches, the outputs of the latches representing differences between the phase and frequency of signals applied to the inputs of the latches.

8. The phase frequency detector of claim 7, wherein each of the latches comprises:

a first source-coupled pair of NMOS devices;

a second pair of source-coupled NMOS devices, the drains of each being connected to the gate of a different one of the first pair of NMOS devices;

a pair of inverters, the input to each connected to the drain of a different one of the first pair of NMOS devices, the output of each constituting the output and output-complement of the latch;

a first inverter connected between the drains of the first pair of NMOS devices, and a second inverter connected between the drains of the second pair of NMOS devices;

a first NOR gate, one input of which is supplied by the drain of one of the first pair of NMOS devices, the other input of which is supplied by an external reset source, and the output of which is connected to the drain of the other of the first pair of NMOS devices;

a second NOR gate, one input of which is supplied by the drain of one of the second pair of NMOS devices, the other input of which is supplied by an external reset source, and the output of which is connected to the drain of the other of the second pair of NMOS devices;

a pair of input switches, each connected to the source coupling of one of the NMOS device pairs, the input switches acting as the input and input-complement to the latch.

9. The phase frequency detector of claim 8, wherein the inverters each comprise:

a PMOS device, the gate of which is coupled to ground, and the drain of which is coupled to a voltage source;

an NMOS device, the drain of which is coupled to the source of the PMOS device to form an output node, and the source of which is coupled to ground;

the inverter input being provided to the gate of the NMOS device and the output being taken from the output node.

10. The phase frequency detector of claim 8, wherein each of the NOR gates comprises:

first and second NMOS devices, the sources of which are coupled to ground, the drains of which are coupled to each other to form an output node, and the gates of which are coupled to receive first and second inputs, respectively;

a PMOS device, the drain of which is coupled to a supply voltage, the source of which is coupled to the output node, and the gate of which is coupled to ground.

11. A fully symmetric CMOS charge-pump filter, comprising:

a voltage supply input;

current mirror means for providing a supply insensitive supply of current;

a fully differential loop filter coupled to receive inputs from the charge pump, the filter including means for converting charge pump input signals into a low frequency control voltage proportional to the magnitude and duty cycle length of the charge pump input signal.

12. The charge pump filter of claim 11, wherein the current mirror means comprises a plurality of drain-coupled PMOS devices, and a plurality of source-coupled NMOS devices coupled to the PMOS devices by a plurality of switches.

* * * * *